United States Patent
Shi

(10) Patent No.: US 7,020,449 B2
(45) Date of Patent: Mar. 28, 2006

(54) FAST SETTLING VARIABLE GAIN AMPLIFIER WITH DC OFFSET CANCELLATION

(75) Inventor: Zhongming Shi, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 476 days.

(21) Appl. No.: 10/274,655

(22) Filed: Oct. 21, 2002

(65) Prior Publication Data

US 2004/0077326 A1    Apr. 22, 2004

(51) Int. Cl.
*H04B 1/12* (2006.01)
(52) U.S. Cl. .................. 455/234.1; 455/307; 455/311; 330/278
(58) Field of Classification Search ................ 455/311, 455/343.1, 574, 313, 234.1, 296; 330/278, 330/85, 86
See application file for complete search history.

(56) References Cited

U.S. PATENT DOCUMENTS

| | | | | |
|---|---|---|---|---|
| 4,739,307 A | * | 4/1988 | Marcovici et al. | 341/122 |
| 5,898,912 A | * | 4/1999 | Heck et al. | 455/234.2 |
| 6,516,185 B1 | * | 2/2003 | MacNally | 455/234.1 |
| 6,516,187 B1 | * | 2/2003 | Williams et al. | 455/313 |
| 6,577,188 B1 | * | 6/2003 | Ueno et al. | 330/85 |
| 6,697,611 B1 | * | 2/2004 | Franca-Neto | 455/296 |
| 6,760,604 B1 | * | 7/2004 | Leizerovich | 455/574 |

\* cited by examiner

*Primary Examiner*—Edward F. Urban
*Assistant Examiner*—Adeel Haroon
(74) *Attorney, Agent, or Firm*—Garlick Harrison & Markison LLP; James A. Harrison

(57) ABSTRACT

A variable gain amplifier includes circuit elements that may be partially powered down during transmit modes of operation and that may be powered back up whenever the radio transceiver receives a data packet within a specified settle time even for high throughput RF communications. The radio transceiver circuit may be powered down even in high throughput communications during a transmit mode to reduce power consumption. A DC offset cancellation block is operably coupled to the variable gain block to substantially remove any DC offset from the amplified output. The variable gain amplifier is further able to provide DC offset cancellation within the required settle time by holding the offset value during a dormant mode of operation. Further, the variable gain amplifier transitions from a first gain control value to a second gain control value and further modifies its internal settle time from a first value to a second value to enable the variable gain amplifier to reach a steady state within the required settle time whenever required. The settle time transitions from the second value back to the first value after a specified period of time.

29 Claims, 10 Drawing Sheets

FAST SETTLING VARIABLE GAIN AMPLIFIER WITH DC OFFSET CANCELLATION

FIELD OF THE INVENTION

This invention relates generally to communication systems and, more particularly, to signal amplification in a Radio Frequency (RF) receiver within wireless devices operating in wireless communication systems.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), wireless application protocols (WAP), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel (e.g., one of the plurality of RF carriers of the wireless communication system) and share information over that channel. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.) to participate in wireless communications. As is known, the receiver receives RF signals, removes the RF carrier frequency from the RF signals via one or more intermediate frequency stages, and demodulates the signals in accordance with a particular wireless communication standard to recapture the transmitted data. The transmitter converts data into RF signals by modulating the data in accordance with the particular wireless communication standard and adds an RF carrier to the modulated data in one or more intermediate frequency stages to produce the RF signals.

As is also known, the receiver is coupled to the antenna and includes a low noise amplifier, one or more intermediate frequency stages, a filtering stage, and a data recovery stage in many designs. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out of band signals to produce a filtered signal. The data recovery stage recovers raw data from the filtered signal in accordance with the particular wireless communication standard.

To carry out filtering at the intermediate frequencies, surface acoustic wave filters (SAW) are commonly used. The SAW filters have the drawback, however, of being bulky, heavy and expensive. Additionally, the SAW filters require low impedance matching thereby resulting in high power consumption. Because they are often powered by battery, portable wireless communication devices are not readily adaptable for such systems in that they are required to be inexpensive, light and consume lower amounts of power. Thus, there is a need to design transceiver systems that eliminate the use of intermediate frequency filters.

An alternate approach to using a higher intermediate frequency that requires the SAW filters is to convert the RF signal to an intermediate frequency sufficiently low to allow the integration of on-chip channel selection filters. For example, some narrow band or low data rate systems, such as Bluetooth, use this low intermediate frequency design approach.

One problem of using low intermediate frequencies, however, is to satisfy the image rejection requirements for the systems. The image rejection requirement for the down-conversion is hard to meet and is usually limited to about −40 dB. Thus, this low intermediate frequency approach is limited for narrow band or low data rate systems. Wide band or high data rate systems require an intermediate frequency that is not low enough for the integration of channel selection filters given the technology that is available today for semiconductor processes. There is a need, therefore, for a wireless transceiver system that allows for full integration on-chip of circuit designs that support high data rate and wideband communications. Stated differently, there is a need for wireless transceiver systems formed on an integrated circuit that have the capability to convert between baseband and a specified RF band in a single step to avoid the image rejection problem discussed above. Thus, it is desirable to design direct conversion radio transceivers to allow a transceiver to be built on one integrated circuit.

As the demand for enhanced performance (e.g., reduced interference and/or noise, improved quality of service, compliance with multiple standards, increased broadband applications, et cetera), smaller sizes, lower power consumption, and reduced costs increases, wireless communication device engineers are faced with a very difficult design challenge to develop such a wireless communication device. Typically, an engineer is forced to compromise one or more of these demands to adequately meet the others. For example, if a device is in power saving mode wherein at least some circuit elements are powered down while the receiver is not receiving data, the powered down circuit element must be powered back up and must reach a steady state within a specified period.

While these design trends exist, there is also constant development being pursued with the goal of increasing data rates. As data rates are increased, circuits have less time to reach a steady state for routine operations. This problem is compounded in those systems in which a circuit must be activated upon receipt of a data frame or packet. As data throughput rates increase, a circuit or radio receiver must reach a steady state during a short preamble period before data packet arrives. As the data rates are increased, however, the preamble period is decreased thereby decreasing the time allowed for a circuit or device to settle or reach a steady state. Thus, utilizing conventional designs, many circuit elements cannot be powered down because their settle time is too large to reach steady state during the shortened preamble periods.

Accordingly, there is a need for radio receivers and, more particularly, radio receiver circuits, to reach a steady state for increasingly shorter preambles or whenever a circuit is merely transitioned from an inactive state to an active state. Moreover, direct conversion transceivers are known to create a DC offset that requires removal prior to amplification by the receiver circuitry. Given the timing restrictions, however, it is difficult for a circuit and, more particularly, a low pass filter, that, in conjunction with a variable gain amplifier including a high pass filter is used to remove the DC offset to settle in the required amount of time under circuit designs. Therefore, a need exists for a circuit that can readily and quickly remove the DC offset and that can also settle within a required settle time for a high throughput communication system.

SUMMARY OF THE INVENTION

A variable gain amplifier in a direct conversion radio transceiver provides DC offset cancellation and fast settle times to allow receiver circuit elements to be selectively powered down to minimize power consumption of the radio transceiver. More specifically, the variable gain amplifier includes a circuit that may be partially powered down during transmit modes of operation and that may be powered back up whenever the radio receiver receives a data packet within a specified settle time even for high throughput RF communications. Accordingly, by utilizing a variable gain amplifier that has a fast settle time and that is further able to provide DC offset cancellation, a circuit design may be implemented to enable powering down portions of the radio transceiver circuit to reduce power consumption.

More specifically, the variable gain block having an input that is coupled to receive a down converted signal based upon a gain control input to produce an amplified output. A DC offset cancellation block is operably coupled to the variable gain block to substantially remove DC offset from the amplified RF output. The DC offset cancellation block provides a signal that is subtracted from the DC offset from the input to the variable gain block, thereby eliminating substantially all of it from amplification and therefore removing the amplified DC offset from the output of the variable gain amplifier. Moreover, the variable gain block is coupled to receive a power up/down control signal that enables it to be turned off whenever the RF transceiver is in a transmit mode of operation. Accordingly, whenever the variable gain amplifier receives a data packet having a preamble, the variable gain block is powered on and reaches a steady state condition within a required settle time, namely, within the preamble. The DC offset cancellation block further is coupled to receive the powered down input to reduce power consumption during transmit modes of operation but is made to substantially hold a DC offset cancellation signal at a substantially fixed value whenever the powered down input is asserted. Accordingly, when a power up signal is asserted, the DC offset cancellation block is able to produce the DC offset cancellation signal to the variable gain block within the required settle time to eliminate any DC offset signal.

One challenge, however, is that often a data packet is received with a new gain level setting. Accordingly, to continue to provide a fast settle time whenever a gain level setting transitions from a first gain value to a second gain value, the variable gain amplifier modifies its internal settle time from a first value to a second value to enable the variable gain amplifier to reach a steady state within the required settle time. The settle time transitions from the second value back to the first value after a specified period of time.

The DC offset cancellation signal may be provided to the input of the variable gain block in a plurality of manners. For example, a DC offset cancellation signal may be provided to a positive input of the variable gain block wherein the DC offset cancellation signal has a magnitude that is opposite to that of the DC offset. Similarly, a DC offset cancellation signal with the same magnitude and polarity as the DC offset may be introduced to a negative input of the variable gain block thereby causing it to substantially cancel the DC offset signal.

A low pass filter is utilized to generate a DC offset cancellation signal. One problem, however, is that the low pass filter is required to have large enough time constant or low enough cutoff frequency to prevent cutting of low frequency portion of the received signal. The large time constant results in a settling time much longer than the required settle time for the radio receiver. Accordingly, the present invention includes circuitry for changing the time constant of the low pass filter whenever a receiver gain level setting has changed thereby requiring the low pass filter to reach steady state to a different voltage condition (either higher or lower). Thus, the present invention includes logic for temporarily changing the time constant and therefore the settle time of the low pass filter to enable it to reach steady state during the preamble of an incoming data packet and then to reset the time constant and settle time to a typical value.

Other features and advantages of the present invention will become apparent from the following detailed description of the invention made with reference to the accompanying drawings.

DETAILED DESCRIPTION

Figure 1:
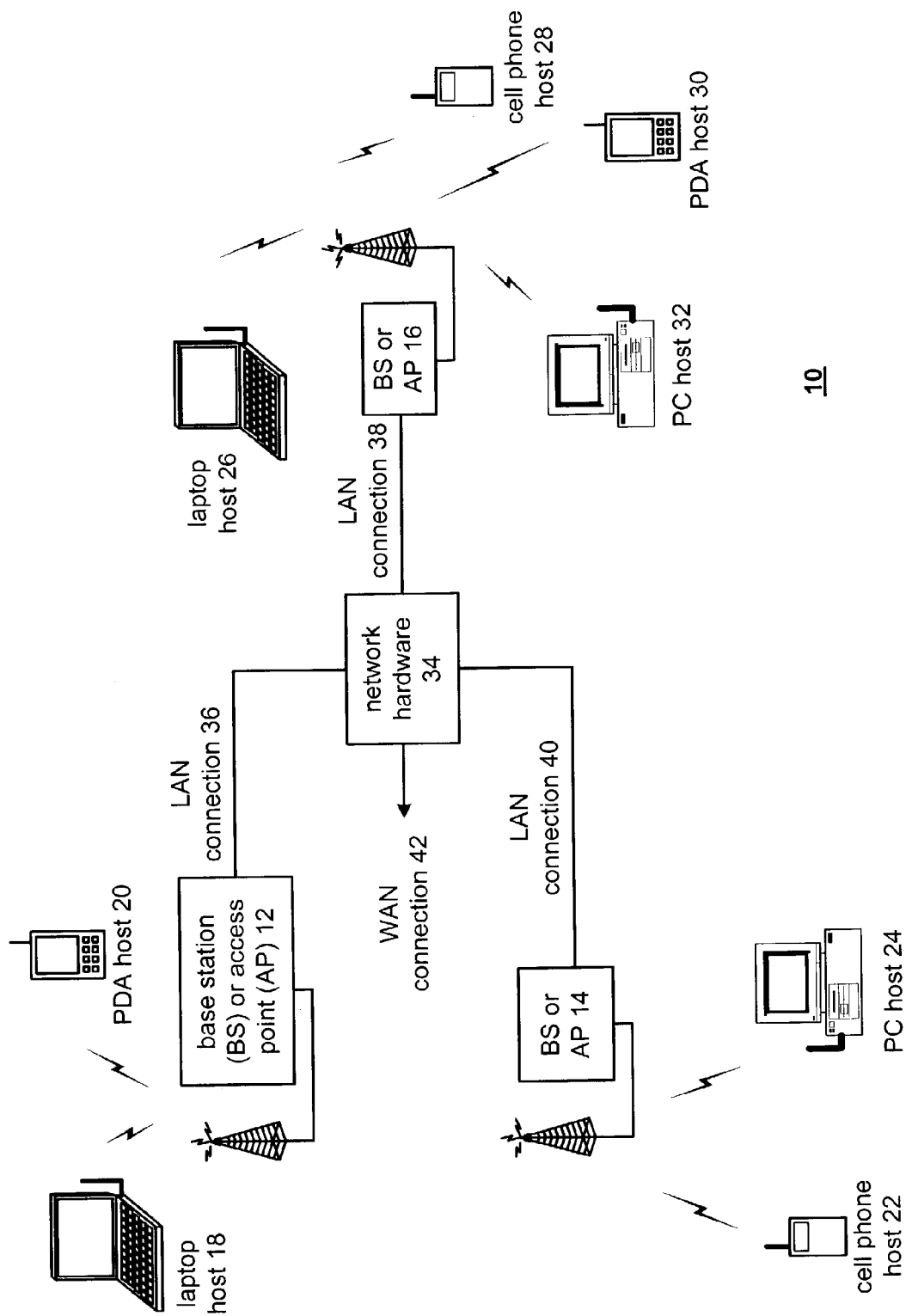
FIG. 1 is a schematic block diagram of a wireless communication system that supports wireless communication devices in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
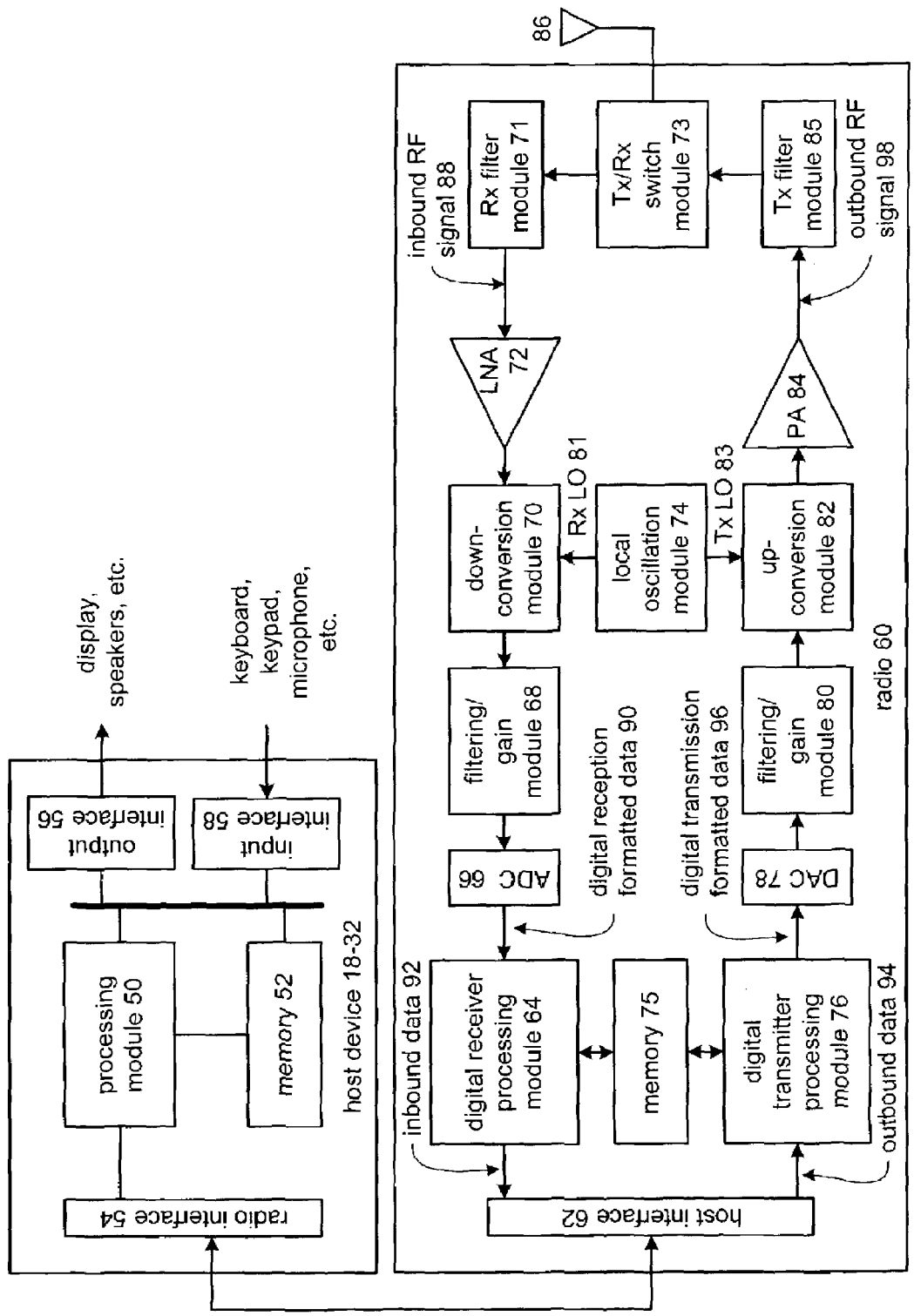
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a receiver filter 71, a low-noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant. Filtering/gain module 68 includes logic and circuitry, including the invention described herein FIGS. 3–9.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions corresponding to at least some of the functions illustrated in FIGS. 3–9.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96.

The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 77, where the Rx filter 71 bandpass filters the inbound RF signal 88. The Rx filter 71 provides the filtered RF signal to low-noise amplifier 72, which amplifies the signal 88 to produce an amplified inbound RF signal. The low-noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/ attenuation module 68. The filtering/attenuation module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one skilled in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3A:
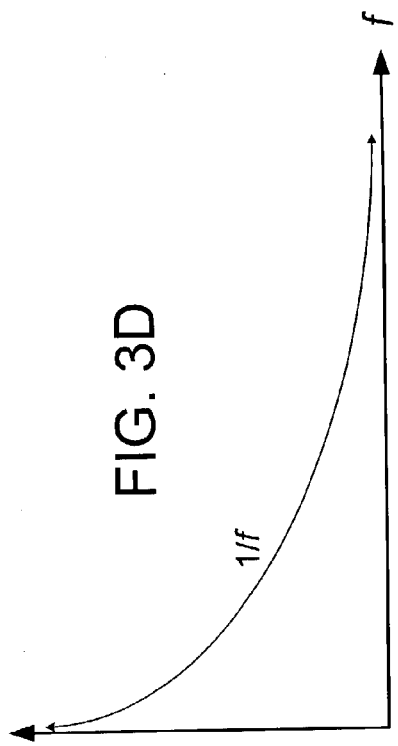
FIGS. 3A, 3B, 3C and 3D are frequency response curves
Figure 3B:
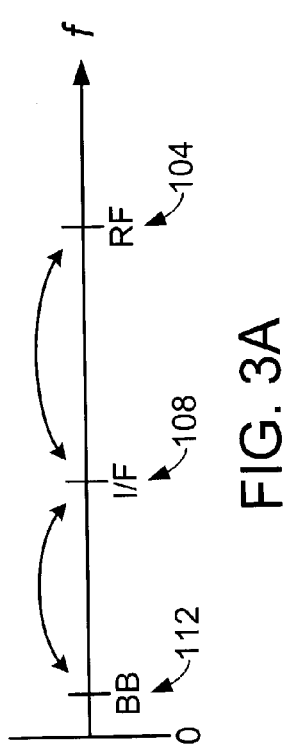
Figure 3C:
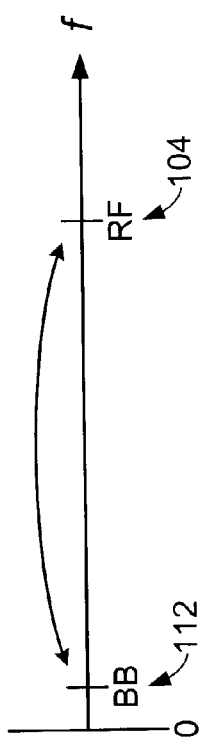
Figure 3D:
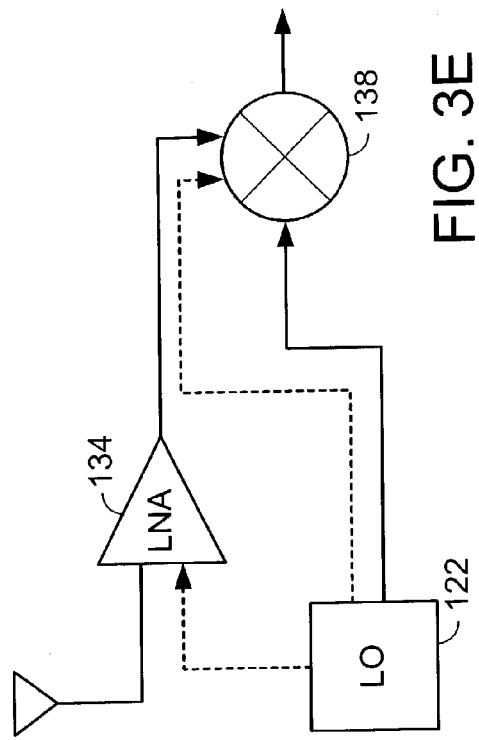
Figure 3E:
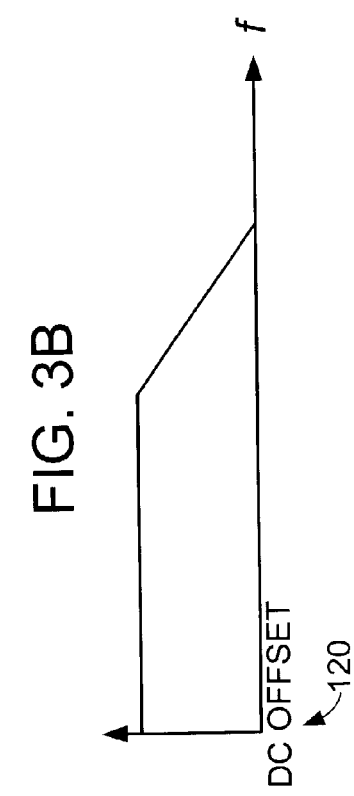
FIG. 3E is a block diagram that collectively illustrate some of the challenges (DC-offset generation) that exist for developing direct conversion transceiver systems that are all integrated within a semiconductor device.

FIGS. 3A, 3B, 3C and 3D are frequency response curves and FIG. 3E is a block diagram that collectively illustrate some of the challenges that exist for developing direct conversion transceiver systems that are all integrated within a semiconductor device. Referring now to FIG. 3A, a signal is transmitted over a wireless medium as an RF signal shown generally at 104. For processing by a receiver, however, that signal is first down-converted to an intermediate frequency (IF) shown generally at 108, wherein some preliminary processing occurs. Thereafter, the signal is down-converted from intermediate frequency 108 to baseband frequency 112.

If the intermediate frequency is low enough, then the filters may be developed on-chip. As described previously, however, the image rejection of the on-chip filters is not always satisfactory. Thus, it is desirable to develop a zero IF direct conversion transceiver system, meaning that no intermediate frequencies are used, as is illustrated in FIG. 3B, in order to satisfy image rejection requirements. Accordingly, received signals are transmitted directly from the RF signal 104 to the baseband frequency 112 as is shown in FIG. 3B. Similarly, signals that are to be transmitted are up-converted from baseband frequency 112 to RF signal 104.

One problem with down-converting signals directly from RF signal 104 to baseband frequency 112 is that the process of down-converting the signal immediately results in a DC offset 120, as is shown in FIG. 3C. Additionally, a noise component, often described as a 1/f noise, is illustrated in FIG. 3D. As may be seen, the 1/f noise is very high at low frequencies but tapers off as the frequency is increased. One problem with the DC offset and the 1/f interference is that any amplification of the received signal includes amplification of 1/f noise and DC offset thereby saturating the amplifier with signals other than the received or target signal.

FIG. 3E further illustrates the process that generates most of the DC offset. For example, a local oscillator (LO) 122 often produces leakage current that is conducted into the input of an amplifier or a mixer. More specifically, as may be seen in FIG. 3E, the LO 122 has leakage current that is conducted into the input of low noise amplifier (LNA) 134 and the input of mixer 138. This type of self mixing produces the most of DC offset at the output of the mixer 138. It is very important, therefore, to eliminate these leakage currents so that the DC offset is at a minimum level.

Figure 4:
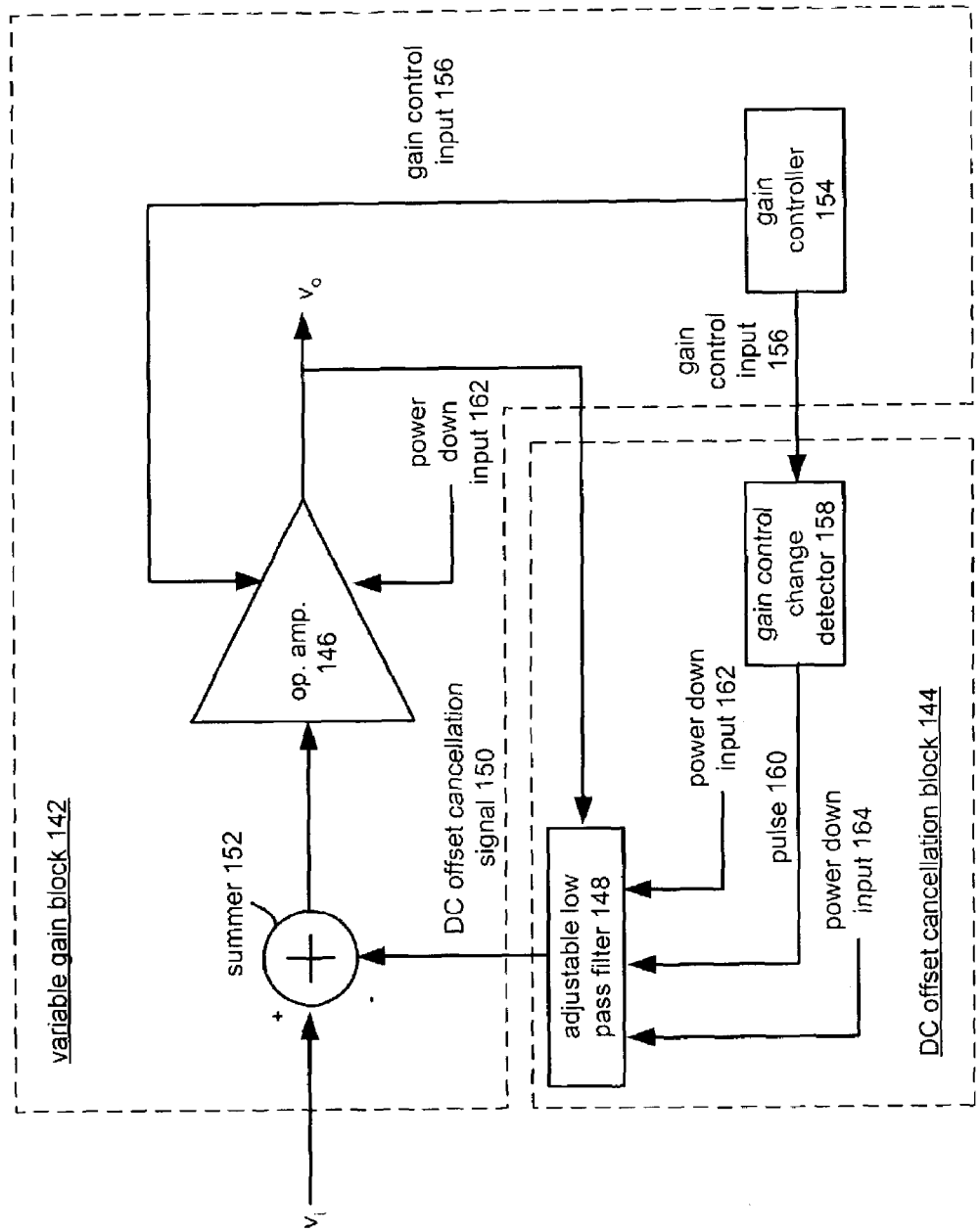
FIG. 4 is a schematic block diagram illustrating one embodiment of a high pass variable gain amplifier.

FIG. 4 is a schematic block diagram illustrating one embodiment of a high pass variable gain amplifier. A high pass variable gain amplifier 140 includes a variable gain block 142 and a DC offset cancellation block 144. DC offset cancellation block 144 produces a DC offset signal to an input of variable gain block 142 to cause variable gain block 142 to cancel a DC offset signal produced in a direct conversion radio receiver. More specifically, the variable gain block 142 receives an input RF signal that has been down converted to a baseband frequency having a DC offset component. Because the DC offset could be as high as few hundreds mV and frequently results in saturation of the high gain amplifiers, the present invention operates to remove the DC offset component of the input signal. Accordingly, the output operational amplifier 146 is the input of the feedback loop to an adjustable low pass filter 148. Adjustable low pass filter 148 then generates a DC offset cancellation signal 150 that is subtracted with the input signal to operational amplifier 146 to cancel the DC offset components. In the example of FIG. 4, the DC offset cancellation signal 150 produced adjustable low pass filter 148 is produced to a minus terminal of a summer 152, while the input signal for the operational amplifier 146 is received at a positive terminal of summer 152. Summer 152, accordingly, sums the two inputs and produces a baseband frequency input signal to operational amplifier 146 without the DC offset component. It is understood that FIG. 4 is functional in nature and that the circuitry represented by summer 152 may be replaced by different circuit elements and different network topologies. For example, the input signal with the DC offset component may be received directly at a positive input terminal of the operational amplifier 146, while the DC offset cancellation signal 150 is merely produced to a minus terminal of the operational amplifier 146. Accordingly, in this embodiment, the operational amplifier 146 performs the summing of the two input signals to remove the DC offset signal from its amplified output.

As may also be seen, the system of FIG. 4 includes a gain controller 154 that generates gain control inputs 156 that are produced to operational amplifier 146, as well as to a gain control change detector 158. Operational amplifier 146 receives the gain control input 156 and, responsive thereto, sets the output gain level for the amplified baseband frequency signal. Gain control change detector 158, however, receives gain control input 156 and determines whether a commanded gain value from gain controller 154 has changed. Whenever the commanded gain level changes, gain control change detector 158 generates a pulse 160 (settle time input) to adjustable low pass filter 148 to prompt adjustable low pass filter 148 to temporarily change its settle time for the duration of the pulse 160. Additionally, operational amplifier 146 adjusts its gain level responsive to the gain control input 156 received from gain controller 154. In an alternate embodiment, pulse 160 (settle time input) is generated by a processor or controller and is provided to adjustable low pass filter 148.

Adjustable low pass filter 148 further is coupled to receive a power down input 162 and a power down input 164. Accordingly, different circuit elements within adjustable low pass filter 148 may be powered down responsive to power down input 162 and power down input 164 being set. Similarly, operational amplifier 146 is coupled to receive power down input 162 and to power down so long as power down input 162 is set.

In operation, summer 152 receives a baseband frequency signal having a DC offset signal at a positive terminal. Summer 152 further receives a DC offset cancellation signal at a negative terminal from adjustable low pass filter 148. Summer 152 acts to sum the two input signals to produce a baseband frequency signal without the DC offset value. The summed output of summer 152 is produced to operational amplifier 146 where it is amplified and produced at an output terminal. An output of operational amplifier 146 is further produced to adjustable low pass filter 148 which generates a DC offset cancellation based upon the DC offset component in the output of operational amplifier 146. Whenever an external device, for example, a baseband processor of a radio receiver, asserts the power down input 162, a portion of adjustable low pass filter 148 is powered down, as is operational amplifier 146. For example, in one embodiment of the invention, the baseband processor generates the power down input 162 whenever the radio transceiver is in a transmit mode of operation. Accordingly, whenever a data packet with a preamble is received, power down input 162 is no longer asserted thereby enabling those portions of adjustable low pass filter 148 and operational amplifier 146 that were powered down to be powered back on and to reach a steady state condition within a specified settle time (the duration of the preamble). When the radio transceiver is turned off, or in other modes of operation, the main portions of adjustable low pass filter 148 may also be powered off whenever the power down input 164 is set. Accordingly, power consumption in the radio transceiver may be reduced by powering down those circuit elements of the radio transceiver that are not required to be on during certain modes of operation. Here, specifically, receiver elements are powered down during transmit modes of operation. A portion of adjustable low pass filter 148 is kept powered on during a transmit mode of operation so as to hold the DC offset cancellation signal, while remaining circuit elements are powered down. One reason for this is that a capacitor that is typically used to hold the DC offset value is sufficiently large that it could not be powered on and charged within the required settle time.

On occasion, when a packet is received, gain controller 154 will generate a new commanded gain level setting in the gain control input 156. Typically, gain controller 154 monitors the received signal strength, as well as noise levels to determine an appropriate gain level setting, as is known by one of average skill in the art. Accordingly, on occasion, the commanded gain level specified in gain control input 156 will be either increased or decreased. Accordingly, gain control change detector 158 is coupled to receive gain control input 156 to determine when a gain level setting has changed. Whenever the gain level setting has changed, gain control change detector 158 generates pulse 160 (settle time input) that is received by adjustable low pass filter 148 to modify an internal time constant by modifying a total resistance value of the adjustable low pass filter to enable the adjustable low pass filter to reach steady state or to fully charge its capacitor within the specified settle time. Upon the expiration of pulse 160, the total resistance value is changed back to the original value thereby resulting in the time constant of the adjustable low pass filter to be reset to the original value. Accordingly, the high pass variable gain amplifier 140 of FIG. 4 is able to power down circuit elements during corresponding modes of operation and then to power those circuit elements back up as appropriate within a specified settle time which, typically, is the period of the preamble of a received data packet.

Figure 5:
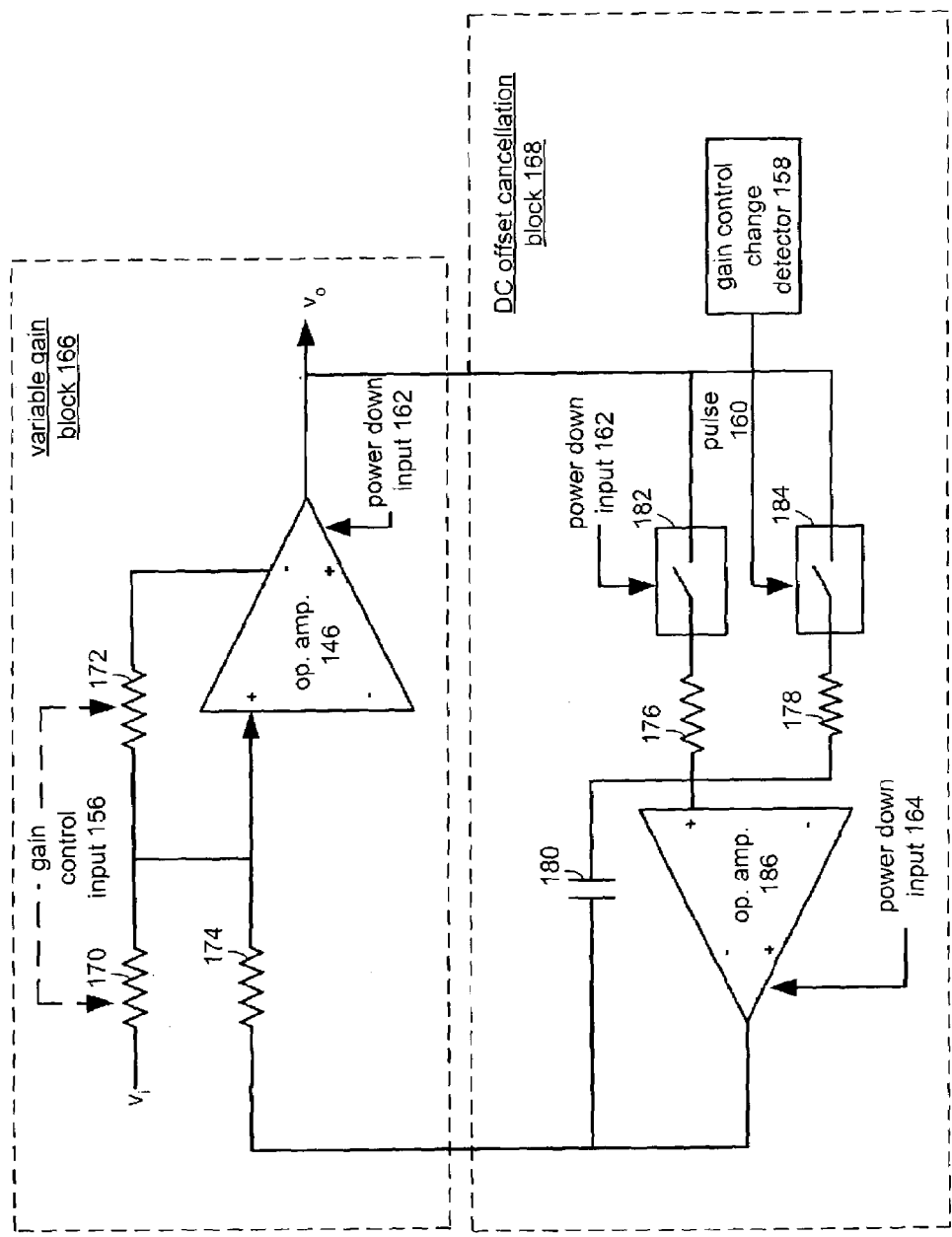
FIG. 5 is a schematic block diagram of one embodiment of the high pass variable gain amplifier of the present invention.

FIG. 5 is a schematic block diagram of one embodiment of the high pass variable gain amplifier of the present invention. More specifically, more details of the high pass variable gain amplifier 140 and, more specifically, of a variable gain block 166 and a DC offset cancellation block 168, are shown. Referring to variable gain block 166, operational amplifier 146 is coupled to receive an input signal having a DC offset component and a baseband frequency component at a positive terminal. Operational amplifier 146 further is coupled to receive at the positive terminal the DC offset cancellation signal having an opposite sign and equal magnitude to the DC offset component received from the input signal at the positive terminal. Accordingly, operational amplifier 146 produces an amplified baseband frequency signal at its output terminal.

Typical values of resistors 170, 172 and 174 used to set the input voltage level range from hundreds of ohms to tens of kilo-ohms. Typical values for resistor 176, in the described embodiment of the invention, is in the range of a few hundred kilo-ohms. To significantly effect the settle time of variable gain amplifier 140, however, resistor 176 must be significantly larger than resistor 178. Thus, in one embodiment, resistor 176 is approximately 10 times greater than resistor 178 in magnitude. In another embodiment of the present invention, resistor 176 is approximately 100 times greater in magnitude than resistor 178. Finally, capacitor 180 has, in the described embodiment of the present invention, the value in the range of few pico-farads.

The high pass variable gain amplifier 140 of FIG. 5 further includes a pair of electrically controllable switches 182 and 184 that are coupled to receive power down input 162 and pulse 160, respectively. Under ordinary operation, when high pass variable gain amplifier 140 is in a receive mode of operation, power down input 162 is asserted to cause high pass filter and operational amplifier 146 to be operational and switch 182 to be closed thereby coupling resistor 176 to an input terminal of low pass filter and operational amplifier 186. Thus, the time constant formed by the combination of capacitor 180 and resistor 176 is partially defined by the value of resistor 176. Whenever a gain level changes, however, a pulse 160 is generated by a gain control change detector, for example, gain control change detector 158 of FIG. 4, which prompts switch 184 to close thereby putting resistor 178 in parallel with resistor 176 to effectively lower the resistive value to that which is approximately equal to the resistive value of resistor 178. Because resistor 178 has a resistance value that is significantly lower than resistor 176, the time constant of the low pass filter and operational amplifier 186 is significantly lowered, thereby reducing the settle time as capacitor 180 charges to the new DC offset value to create a new DC offset cancellation signal. Upon expiration of pulse 160, switch 184 is opened thereby causing the settle time and time constant to resume to a normal value. operational amplifier 186 also is coupled to receive power down input 164. Responsive thereto, operational amplifier 186 powers down so long as power down input 164 is asserted. As with the system of FIG. 4, operational amplifier 146 is coupled to receive and respond to gain control input 156.

Figure 6:
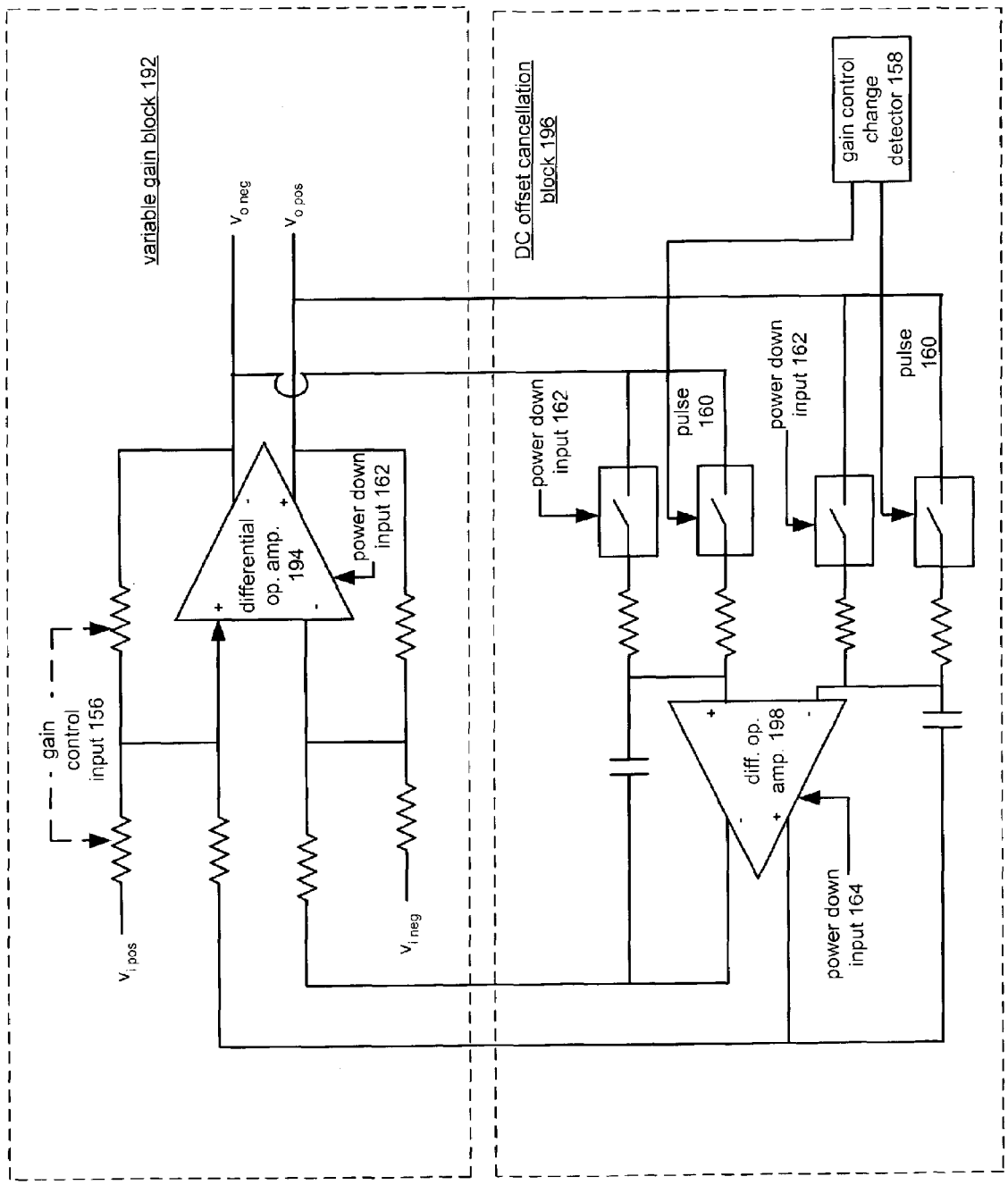
FIG. 6 is a schematic block diagram of a differential high pass variable gain amplifier.

FIG. 6 is a schematic block diagram of a differential high pass variable gain amplifier 190. The operation of the differential high pass variable gain amplifier 190 is similar to the operation of high pass variable gain amplifier 140 of FIG. 5 except that it is differential in nature. One of average skill in the art can readily appreciate that a differential system, such as shown in FIG. 6, merely duplicates the operation described with respect to FIG. 5 wherein one portion of the signal is negative and one portion of the signal is positive in polarity. Thus, a variable gain block 192 includes a differential high pass filter and operational amplifier 194, while DC offset cancellation block 196 includes a differential low pass filter and operational amplifier 198. As with the system of FIG. 5, the system of FIG. 6 is coupled to receive and respond to power down input 162, pulse 160, power down input 164 and gain control input 156, as described in the system of FIG. 5, except that FIG. 6 merely illustrates a differential version of the system of FIG. 5.

Figure 7:
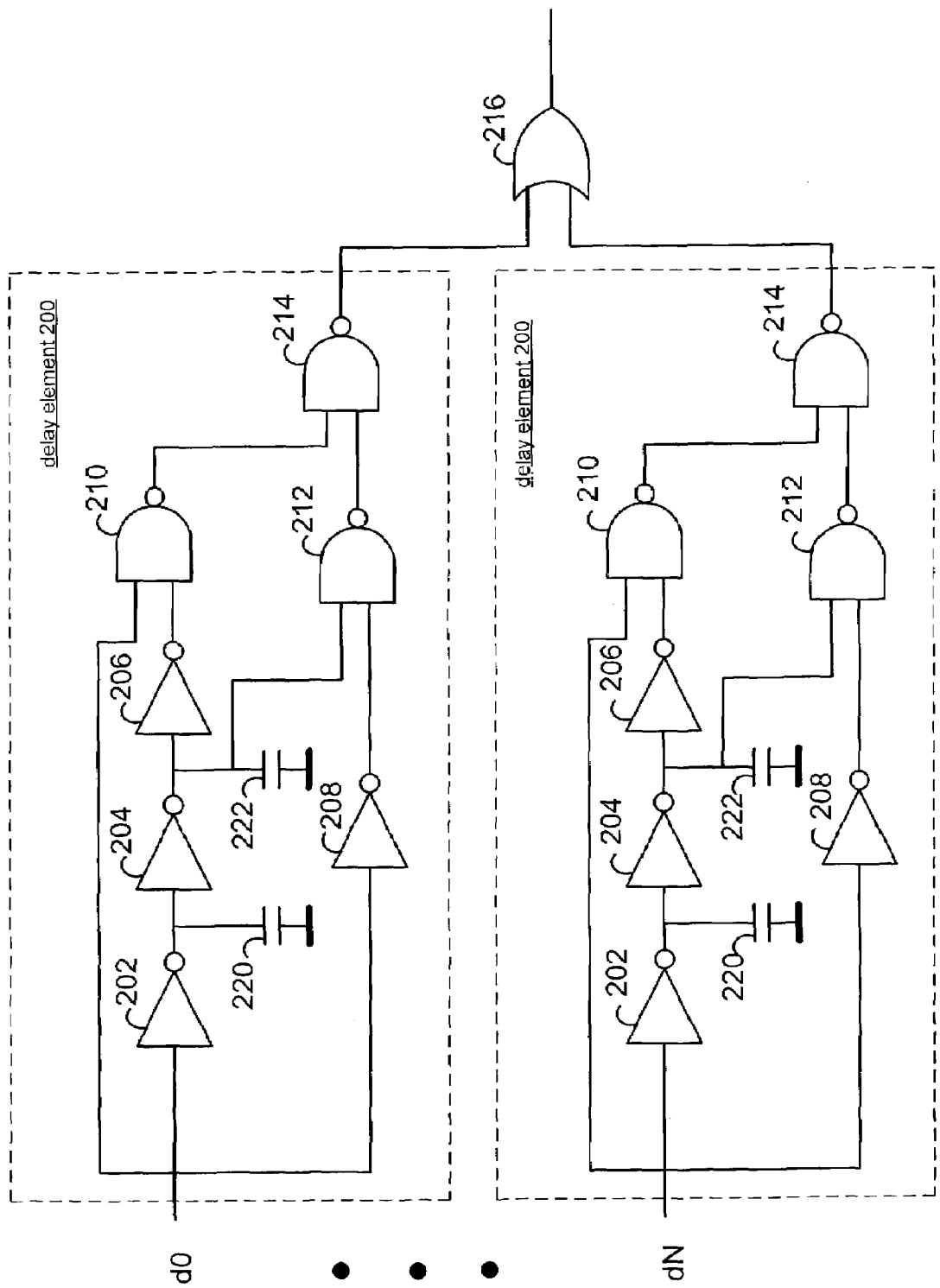
FIG. 7 is a functional schematic diagram of a gain control change detector formed according to one embodiment of the present invention.

FIG. 7 is a functional schematic diagram of a gain control change detector formed according to one embodiment of the present invention. Gain control change detector 158 of FIG. 4 includes a plurality of delay elements 200 that are used to generate pulse 160 which, when compared at the output, result in a temporary pulse that is used to adjust a settle time as described herein. Each delay element 200 includes a plurality of inverters, NAND gates and capacitors configured to achieve the desired result. More specifically, a digital signal is applied to an inverter 202 that is coupled in series with inverters 204 and 206. The signal is further applied to an inverter 208 and to a NAND gate 210. The output of inverter 206 further is produced to NAND gate 210, while the output of inverter 208 is produced to a NAND gate 212. The outputs of NAND gates 210 and 212 are produced to a NAND gate 214 whose output, in turn, is produced to an OR gate 216. The outputs of inverters 202 and 204 are further coupled to a pair of capacitors, namely, capacitors 220 and 222, respectively. The output of inverter 204 further is coupled to NAND gate 212. As long as the digital signal does not change states, NAND gate 214 generates a logic 0. Whenever the digital signal changes states, however, NAND gate 214 generates a pulse of a specified duration. One delay element 200 is provided to monitor each bit of a gain control input 156, as shown in FIGS. 5 and 6, provided by a controller or processor.

One of average skill in the art can readily appreciate the operation of gain control change detector 158. In general, as long as the value of the input d0 does not change, the outputs of NAND gates 210 and 212 remain equal, thereby causing the output of NAND gate 214 to be equal to a logic 0. Whenever the outputs of NAND gates 210 and 212 are different, however, NAND gate 214 produces a logic 1, which results in an output of a pulse from OR gate 216. The outputs of NAND gates 210 and 212 are not equal when the capacitors 220 and 222 are not in a steady state condition and either are charging or discharging according to the direction of the change in voltage level.

For example, when d0 changes from logic 1 to logic 0, the output of inverter 202, while tending to go to logic 1, would be shorted to ground by capacitor 220 before capacitor 220 becomes charged. Accordingly, the input of inverter 204 remains logic 0 and its output remains logic 1. The logic 1 input of inverter 206 results in logic 0 being produced to NAND gate 210. On the other hand, NAND gate 210 receives logic 0 since it is coupled to also receive the d0 input. Thus, NAND gate 210 produces logic 1 output. The input of NAND gate 212 received from the output of inverter 204 also is logic 1, while the input received from inverter 208 also is equal to logic 1 resulting in the output of NAND gate 212 being equal to logic 0. Thus, NAND gate 214 produces logic 1 until capacitors 220 and 222 reach their steady state condition and NAND gate 214 receives two logic 1 signals from NAND gates 210 and 212, respectively.

Continuing to refer to FIG. 7, the above-described operation is merely for detecting a change for one logic signal. More specifically, in the above example, NAND gate 214 produces logic 1 whenever the value of signal d0 changes from logic 1 to logic 0 or vice versa for a specified period. As may also be seen, however, the circuitry described to detect that change in logic states is repeated for each logical signal that is to be monitored. Accordingly, if a digital gain control output signal from a microcomputer, microprocessor, such as a baseband processor, or other digital device, produces a 16-bit signal, then 16 delay elements 200 would be provided for, wherein the output of each NAND gate 214 would be provided as an input to OR gate 216.

Figure 8:
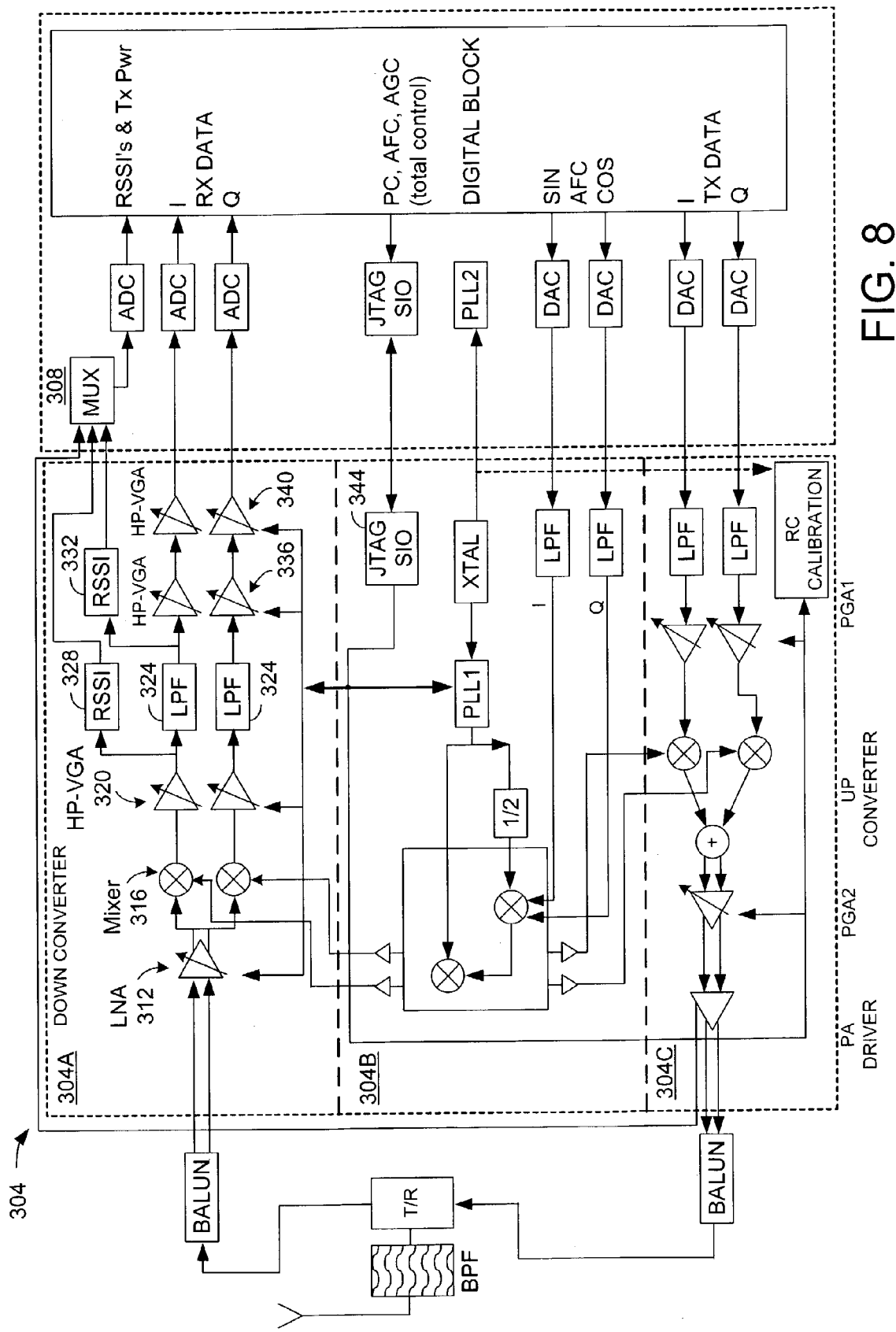
FIG. 8 is a functional schematic diagram of a direct conversion radio transceiver formed according to one embodiment of the present invention.

FIG. 8 is a functional schematic diagram of a direct conversion radio transceiver formed according to one embodiment of the present invention. Referring now to FIG. 8, a transceiver system comprises radio circuitry 304 that is coupled to baseband processing circuitry 308. The radio circuitry 304 performs filtering, amplification, frequency calibration (in part) and frequency conversion (down from the RF to baseband and up from baseband to the RF). Baseband processing circuitry 308 performs the traditional digital signal processing in addition to partially performing the automatic frequency control. As may be seen, the single chip radio circuitry 304 is coupled to receive radio signals that are initially received by the transceiver and then converted by a Balun signal converter, which performs single end to differential conversion for the receiver (and differential to single end conversion for the transmitter end). The Balun signal converters are shown to be off chip-in FIG. 8, but they may be formed on-chip with radio circuitry 304 as well. Similarly, while the baseband processing circuitry 308 is shown off-chip, it also may be formed on-chip with radio circuitry 304.

Radio circuitry 304 and, more particularly, circuitry portion 304A, includes a low noise amplifier 312 that is coupled to receive RF signals from a transceiver port. The low noise amplifier 312 then produces an amplified signal to mixers 316 that are for adjusting and mixing the RF with a local oscillation signal. The outputs of the mixers 316 (I and Q components of quadrature phase shift keyed signals) are then produced to a first HP-VGA 320.

The outputs of the first HP-VGA 320 are then produced to a first RSSI 328 as well as to a low pass filter 324. The outputs of the low pass filter 324 are then produced to a second RSSI 332, as well as to a second HP-VGA 336 and a third HP-VGA 340 as may be seen in FIG. 8.

In operation, the first RSSI 328 measures the power level of the signal and interference. The second RSSI 332 measures the power level of the signal only. The baseband processing circuitry 308 then determines the ratio of the RSSI measured power levels to determine the relative gain level adjustments of the front and rear amplification stages. In the described embodiment of the invention, if the power level of the signal and interference is approximately equal to or slightly greater than the power level of the signal alone, then the first amplification stages are set to a high value and the second amplification stages are set to a low value. Conversely, if the power level of the signal and interference is significantly greater than the power of the signal alone, thereby indicating significant interference levels, the first amplification stages are lowered and the second amplification stages are increased proportionately.

Circuitry portion 304B includes low pass filters for filtering I and Q component frequency correction signals and mixer circuitry for actually adjusting LO signal frequency. The operation of mixers and phase locked loop for adjusting frequencies is known. Circuitry portion 304B further includes JTAG (Joint Test Action Group, IEEE1149.1 boundary-scan standard) serial interface (SIO) circuitry 344 for transmitting control signals and information to circuitry portion 304A (e.g., to control amplification levels) and to a circuitry portion 304C (e.g., to control or specify the desired frequency for the automatic frequency control).

A portion of the automatic frequency control circuitry that determines the difference in frequency between a specified center channel frequency and an actual center channel frequency for a received RF signal is formed within the baseband circuitry in the described embodiment of the invention. This portion of the circuitry includes circuitry that coarsely measures the frequency difference and then measures the frequency difference in the digital domain to obtain a more precise measurement and to produce frequency correction inputs to circuitry portion 304B.

Finally, radio circuitry portion 304C includes low pass filtration circuitry for removing any interference that is present after baseband processing as well as amplification, mixer and up-converter circuitry for preparing a baseband signal for transmission at the RF.

The direct conversion radio transceiver of FIG. 8 is provided to illustrate one embodiment of the invention of a direct conversion radio transceiver. While all of the disclosed and claimed circuit elements are shown specifically in FIG. 8, it is understood that the inventive circuitry disclosed herein is implemented within a direct conversion radio transceiver as shown herein FIG. 8. For example, the disclosed and claimed circuit elements are coupled to and operate within a system similar to this shown in FIG. 8. The HP-VGAs 320 and/or 336 and 340 may be coupled to receive the power down input 162 while the low pass filters include the DC offset cancellation block circuit elements disclosed herein and are coupled to receive the pulse 160 as well as the power down inputs 162 and 164.

Figure 9:
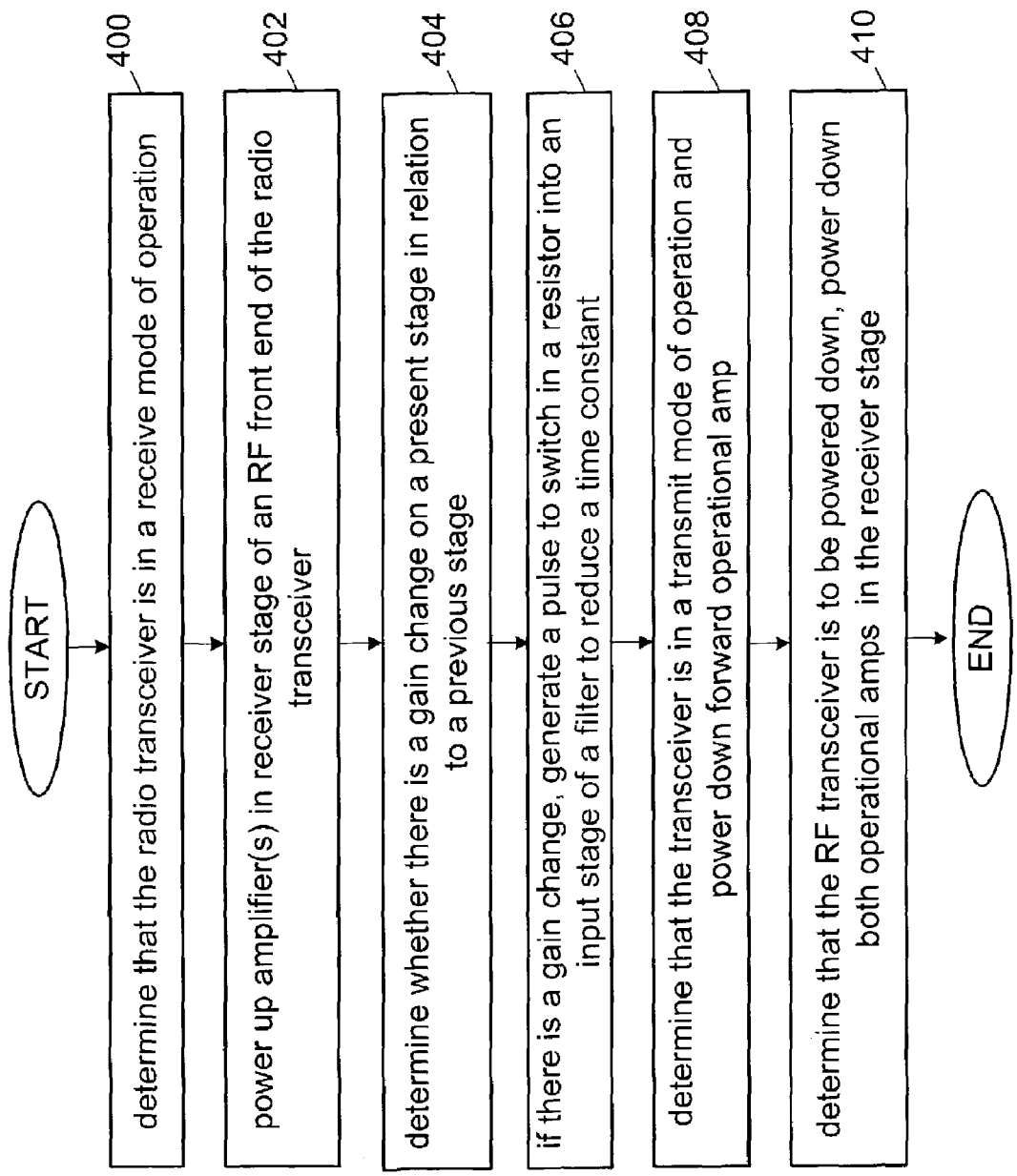
FIG. 9 is a flowchart that illustrates operation of the present invention according to one embodiment.

FIG. 9 is a flowchart that illustrates operation of the present invention according to one embodiment. Initially, a radio transceiver determines that it is in a receive mode of operation (step 400). One significance of the radio transceiver being in the receive mode of operation is that various receiver circuit elements that may have been powered down to conserve battery life or, more generally, power will require being powered back on with a required settle time. Thus, when the determination is made that the transceiver is in a receive mode of operation (i.e., it has just transitioned to a receive mode), any receiver elements that are powered down will require being powered on. This determination may be made in hardware or by software executed by a processor. Thus, a second step includes powering on a variable gain amplifier and a portion of a low pass filter when the radio transceiver is in the receive mode of operation (step 402). When a data packet is received, the radio transceiver determines that it is in a receive mode of operation when a first preamble period has been received for the data packet after the transceiver has been powered off or has been in a transmit mode of operation (dormant state). Generally, a radio receiver that is in a dormant state must be operational in and in a steady state mode of operation by the termination of the preamble period. As stated before, a design goal is to reach steady state for these circuit elements that have been powered down and then back up within a specified period which is equal to or less than the duration of the preamble.

The next step includes determining whether there is a gain change on a present stage in relation to a previous stage (step 404). At the same time that the variable gain amplifier and powered down portion of the low pass filter are being brought back up into a steady state condition, the invention includes determining whether a gain level setting for the data packet being received has changed from a last gain level setting for a last received data packet so that an input time constant may be modified if necessary to satisfy settle time requirements. Thus, if there is a gain change, generate a pulse to switch in a resistor into an input stage of a filter to reduce an input resistance value for a short period of time to reduce a time constant (step 406). For example, in the embodiment of FIG. 5, resistor 178 is switched into parallel with resistor 176 to reduce the overall input resistance and the time constant of the filter. Thus, if the gain level setting has changed, a low pass filter settle time is changed from a first settle time value to a second settle time value so that the low pass filter settle time settles within the required period.

In one embodiment of the present invention, the settle time is changed by modifying a time constant of the low pass filter by modifying a resistance value therefor. Alternatively, however, the capacitance value may be modified or a combination of the capacitance and resistive values maybe modified to reduce the settle time.

Thereafter, the invention includes determining that the transceiver is in a transmit mode of operation and powering down the forward operational amplifier (step 408). For example, operational amplifier 146 of FIG. 5 is powered down when the transceiver is in a transmit mode of operation. Finally, the invention includes determining that the RF transceiver is to be powered down and powering down both operational amplifiers in the receiver stage (step 410).

Figure 10:
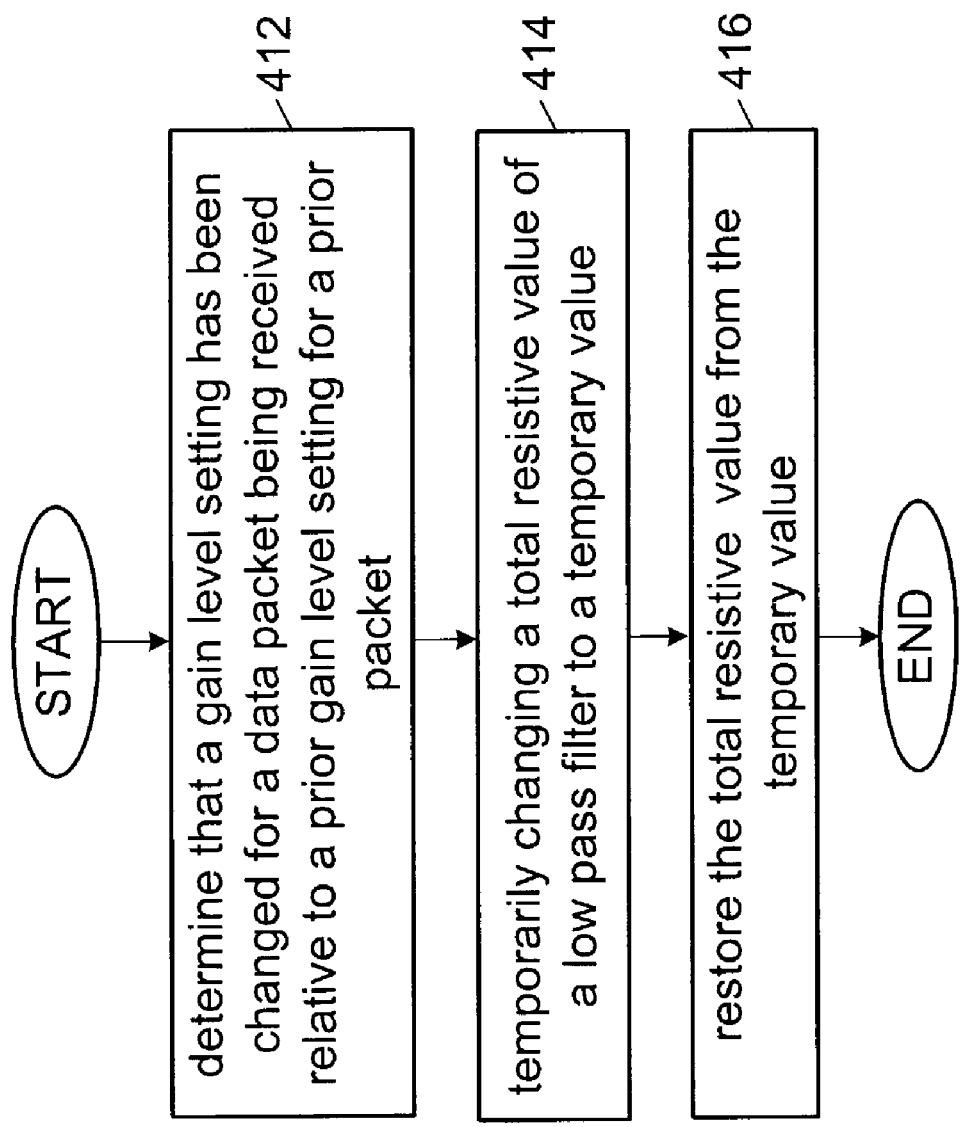
FIG. 10 is a flowchart illustrating an aspect of one embodiment of the inventive method.

FIG. 10 is a flowchart illustrating an aspect of one embodiment of the inventive method. Initially, it is determined that a gain level setting has changed for a data packet being received relative to a prior gain level setting for a prior packet (step 412). In one embodiment of the invention, this determination is made in hardware with logic circuitry that generates a pulse that reflects that a gain level setting has changed. This determination may also be made in software by a baseband processor, although the results may be slower and not as precise. The use of a baseband processor for this determination step is included as an alternate embodiment of the present invention, however. Thereafter, the inventive method includes temporarily changing a total resistive value of a low pass filter to a temporary value (step 414). Thereafter, the total resistive value is restored from the temporary value (step 416).

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. A Radio Frequency (RF) variable gain amplifier in a direct conversion radio transceiver providing DC offset cancellation, the variable gain amplifier comprising:
   a variable gain block having an input that receives a received signal, wherein the variable gain block amplifies the signal based upon a gain control input to produce an amplified output;
   a DC offset cancellation block operably coupled to the variable gain block to substantially remove any DC offset from the amplified output;
   circuitry operable to generate a settle time input comprising a pulse for a specified duration responsive to a gain change in the variable gain block while providing the DC offset cancellation; and
   wherein the DC offset cancellation block includes a low pass filter that receives the settle time input and is operable to adjust the settle time of the low pass filter of the DC offset cancellation block responsive to the settle time input.

2. The variable gain amplifier of claim 1, wherein:
   the variable gain block further receives a power down input, wherein the variable gain block powers down when the power down input is asserted; and
   the DC offset cancellation block further receives the power down input, wherein the DC offset cancellation block holds a DC offset cancellation signal at a substantially fixed value when the power down input is asserted.

3. The variable gain amplifier of claim 2, wherein the DC offset cancellation block remains powered when the variable gain block powers down.

4. The variable gain amplifier of claim 3, wherein when the gain control input transitions from a first gain control value to a second gain control value, the settle time input transitions from a first value to a second value for a predetermined period of time and then transitions back to the first value.

5. The variable gain amplifier of claim 1, wherein when the gain control input transitions from a first gain control value to a second gain control value, the settle time input transitions from a first value to a second value for a predetermined period of time and then transitions back to the first value.

6. The variable gain amplifier of claim 1, wherein the DC offset cancellation block is operably coupled to provide an inverted DC component to a positive input of the variable gain block to substantially remove any DC offset from the amplified RF output.

7. The variable gain amplifier of claim 1, wherein the DC offset cancellation block is operably coupled to provide a non-inverted DC component to a negative input of the variable gain block to substantially remove any DC offset from the amplified RF output.

8. The variable gain amplifier of claim 1 wherein the low pass filter of the DC offset cancellation block is coupled to receive a settle time input from a baseband processor of the radio transceiver.

9. A variable gain amplifier providing DC offset cancellation, the variable gain amplifier comprising:
   a variable gain block having an input that receives a received signal, wherein the variable gain block amplifies the signal based upon a gain control input to produce an amplified output, wherein the variable gain block further receives a power down input, and wherein the variable gain block powers down when the power down input is asserted; and
   a DC offset cancellation block including logic for generating a pulse comprising a settle time input for a specified duration responsive to a gain change in the variable gain block while providing DC offset cancellation wherein the DC offset cancellation block is operably coupled to the variable gain block to substantially remove any DC offset from the input, wherein the DC offset cancellation block receives a settle time input that adjusts a settle time of the DC offset cancellation block, and wherein the DC offset cancellation block further receives the power down input, wherein the DC offset cancellation block holds a DC offset cancellation signal at a substantially fixed value when the power down input is asserted.

10. The variable gain amplifier of claim 9 wherein the DC offset cancellation block is coupled to receive at least two settle time inputs which settle time inputs selectively couple at least one of at least two resistive values of a low pass filter to an amplifier of the low pass filter to modify a settle time of the low pass filter.

11. The variable gain amplifier of claim 10 wherein a first resistive value of the at least two resistive values is at least approximately ten times greater in magnitude than a second resistive value of the at least two resistive values.

12. The variable gain amplifier of claim 10 wherein a first resistive value of the at least two resistive values is approximately one hundred times greater in magnitude than a second resistive value of the at least two resistive values.

13. The variable gain amplifier of claim 9 wherein the DC offset cancellation block has a first settle time whenever a data packet is received having a gain level setting that is the same as the gain level setting of a previous data packet.

14. The variable gain amplifier of claim 9 wherein the DC offset cancellation block has a second settle time whenever a data packet is received having a gain level setting that is different as the gain level setting of a previous data packet.

15. A variable gain amplifier providing DC offset cancellation, the variable gain amplifier comprising:
   a variable gain block having an RF input that receives a received signal, wherein the variable gain block amplifies the signal based upon a gain control input to produce an amplified RF output;
   a DC offset cancellation block operably coupled to the variable gain block to substantially remove any DC offset from the amplified output, wherein the DC offset cancellation block receives a settle time input that adjusts a settle time of the DC offset cancellation block, wherein when the gain control input transitions from a first gain control value to a second gain control value, the settle time input transitions from a first value to a second value for a predetermined period of time and then transitions back to the first value;
   a pulse generator coupled to detect the transitions in the gain control input and responsive thereto, for producing a pulse to selectively couple a resistive value to an input of an amplifier of the DC offset cancellation block, the pulse for temporarily adjusting the settle time; and
   wherein the pulse generator further includes first and second delay blocks, each of the first and second delay blocks including a plurality of inventers coupled in series and coupled to a corresponding plurality of capacitors coupled across an output of each of the plurality of inverters, the pulse generator further including a comparator for generating a pulse responsive to a change in the gain level setting, the comparator coupled to receive an output from each of the first and second delay blocks.

16. The variable gain amplifier of claim 15 wherein each capacitor of the plurality of capacitors of the pulse generator is variable and is coupled to receive a control signal from a baseband processor to adjust a capacitance value.

17. A method for canceling a DC offset value in a direct conversion radio transceiver, comprising:
   determining that the radio transceiver is in a transmit mode of operation;
   powering down a variable gain amplifier while the radio transceiver is in the transmit mode of operation;
   determining that the radio transceiver is in a receive mode of operation and that a preamble has been received for a data packet being received;
   powering up the variable gain amplifier;
   determining whether a gain level setting for the data packet being received has changed from a last received data packet; and
   if the gain level setting has changed, changing a low pass filter settle time from a first settle time value to a second settle time value.

18. The method of claim 17 further including resetting the low pass filter settle time to the first settle time value.

19. A method for canceling a DC offset in a direct conversion radio receiver, comprising:
   determining that a gain level setting corresponding to a gain change has been changed for a data packet being received relative to a prior gain level setting for a prior packet;
   generating a pulse that defines a settle time input for changing a circuit settle time for a specified duration responsive to gain change in a variable gain amplifier while providing DC offset cancellation;
   temporarily changing a total resistive value of a low pass filter to a temporary value; and
   restoring the total resistive value from the temporary value.

20. The method of claim 19 wherein the determining step is performed in hardware.

21. The method of claim 19 wherein the determining step is performed in software by a baseband processor.

22. A variable gain amplifier providing DC offset cancellation, the variable gain amplifier comprising:
   means for generating a pulse that defines a settle time input for changing a circuit settle time for specified duration responsive to a gain change in a variable gain amplifier while providing the DC offset cancellation;
   means for determining the gain change; and
   means for receiving the settle time input and for temporarily changing the circuit settle time.

23. The variable gain amplifier of claim 22 wherein the means for determining the gain change comprises a processor.

24. The variable gain amplifier of claim 22 wherein the means for determining the gain change comprises logic circuitry that generates a pulse for a specified duration whenever a gain value has changed.

25. The variable gain amplifier of claim 24 wherein the pulse is produced to the means for receiving the settle time input.

26. A variable gain amplifier providing DC offset cancellation, the variable gain amplifier comprising:
   an amplification module for providing variable gain amplification of an incoming signal;
   a logic gate for generating a pulse of a specified duration responsive to a change in a received gain level control bit; and
   a low pass filter including a resistor module on an input side of the low pass filter, the resistor module coupled to receive the pulse and for changing a resistive input value responsive to receiving the pulse.

27. The variable gain amplifier of claim 26 further including logic to turn off an amplification module whenever the variable gain amplifier is in a transmit mode of operation.

28. The variable gain amplifier of claim 26 wherein the low pass filter is a DC offset cancellation block operably coupled to the amplification module to substantially remove any DC offset from the amplified RF output.

29. The variable gain amplifier of claim 28 wherein the resistor module transitions from a first gain control value to a second gain control value and wherein a settle time of the low pass filter transitions from a first value to a second value for a predetermined period of time and then transitions back to the first value.

* * * * *